US008659042B2

(12) United States Patent
Paschkewitz et al.

(10) Patent No.: US 8,659,042 B2
(45) Date of Patent: Feb. 25, 2014

(54) INTEGRATED REFLECTOR AND THERMAL SPREADER AND THERMAL SPRAY FABRICATION METHOD

(75) Inventors: John S. Paschkewitz, San Carlos, CA (US); Eric Shrader, Belmont, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 452 days.

(21) Appl. No.: 12/974,575

(22) Filed: Dec. 21, 2010

(65) Prior Publication Data
US 2012/0153325 A1    Jun. 21, 2012

(51) Int. Cl.
H01L 33/00    (2010.01)
(52) U.S. Cl.
USPC .................. 257/98; 257/E33.075
(58) Field of Classification Search
USPC ................ 257/98, 714, 675, 676, E33.072, 257/E33.075, E23.103, 712, 713
See application file for complete search history.

(56) References Cited

U.S. PATENT DOCUMENTS

| | | | |
|---|---|---|---|
| 4,018,269 A | | 4/1977 | Honda et al. |
| 4,985,815 A | * | 1/1991 | Endo .............................. 362/294 |
| 5,299,090 A | | 3/1994 | Brady et al. |
| 5,351,748 A | | 10/1994 | Dagan |
| 5,947,590 A | * | 9/1999 | Meuse et al. .................. 362/264 |
| 5,988,266 A | | 11/1999 | Smith et al. |
| 6,000,132 A | | 12/1999 | Butler |
| 6,173,758 B1 | | 1/2001 | Ward et al. |
| 6,591,897 B1 | | 7/2003 | Bhatti et al. |
| 7,559,676 B2 | * | 7/2009 | Rasmussen et al. ........... 362/264 |
| 2002/0056908 A1 | * | 5/2002 | Brownell et al. .............. 257/714 |
| 2008/0117637 A1 | | 5/2008 | Chang et al. |
| 2008/0291675 A1 | * | 11/2008 | Lin et al. ........................ 362/247 |
| 2009/0025784 A1 | | 1/2009 | Chan et al. |
| 2009/0067182 A1 | * | 3/2009 | Hsu et al. ....................... 362/373 |
| 2009/0321768 A1 | * | 12/2009 | Chang ............................ 257/98 |
| 2010/0213808 A1 | * | 8/2010 | Shi .................................. 313/46 |
| 2011/0067843 A1 | * | 3/2011 | Vasiliev, Jr. ............... 165/104.26 |
| 2011/0273890 A1 | * | 11/2011 | Riesebosch .................... 362/294 |
| 2012/0170280 A1 | * | 7/2012 | Choquet ......................... 362/335 |

FOREIGN PATENT DOCUMENTS

| | | | |
|---|---|---|---|
| FR | 2798986 A1 | * | 3/2001 |
| WO | 2006/070955 A1 | | 6/2006 |
| WO | WO 2009/092863 A1 | * | 7/2009 |

OTHER PUBLICATIONS

B. Suman, "On the Fill Charge and the Sensitivity Analysis of a V-Shaped Micro Heat Pipe", AlChE J., vol. 52, No. 9, pp. 3041-3054 (2006).
C. Sobhan et al., "A review and comparative study of the investigations on micro heat pipes", Int. J. of Energy Res., vol. 31, pp. 664-688 (2007).
Groll, Manfred et al., "Keynote Paper—State of the Art on Pulsating Heat Pipes", Proceedings of ICMM2004, The 2nd International Conference on Microchannels and Minichannels, pp. 1-12, Jun. 17-19, 2004, Rochester, New York.

* cited by examiner

*Primary Examiner* — Daniel Luke
*Assistant Examiner* — Latanya N Crawford
(74) *Attorney, Agent, or Firm* — Jon Small

(57) ABSTRACT

A low-cost integrated reflector and heat spreader for high-density high power solid-state (e.g., LED) lighting arrays includes a base structure onto which is applied a sacrificial material. A relatively thick thermal spray coating is applied over the base structure and sacrificial material. The sacrificial material is removed. A channel(s) is thereby provided within the thermal spray coating layer and in physical contact with the base structure. The channel may be filled with a cooling fluid. A pulsating heat pipe heat spreader may thereby be provided. A reflective material may be provided either over another surface of the base structure or alternatively over the thermal spray coating layer to provide a surface for reflecting and directing light emitted from a solid state light source that may be secured to the integrated reflector and heat spreader.

9 Claims, 7 Drawing Sheets

INTEGRATED REFLECTOR AND THERMAL SPREADER AND THERMAL SPRAY FABRICATION METHOD

BACKGROUND

The present invention relates generally to cooling apparatus for use with light emitting diodes (LEDs), and more particularly to an LED lamp cooling apparatus using a thermal spay reflector for improving heat dissipation.

LEDs have been widely used in the field of illumination due to their small volume in size and high efficiency. LEDs are becoming more widely used in residential and commercial general lighting applications as the energy efficiency and cost-effectiveness of LEDs increases. In general, the light output portion of an LED is disposed within a reflector, which assists with directing the light output from the LED and increases its efficiency. Reflectors are currently made using a plastic or glass substrate that is then vacuum-coated or painted with a silvering material. These reflectors are often referred to as "second surface" reflectors as distinguished from "first surface" reflectors having a reflector surface formed of the reflector body material, for example by thermal spray techniques such as described in U.S. Patent Application Publ. 2009/0025784, which is incorporated herein by reference. Second surface reflectors are inexpensive to produce, but do not provide a thermal control function.

It is well known that LEDs generate heat when they emit light. If this heat is not quickly removed, these LEDs may overheat, and thus their work efficiency and service life can be significantly reduced, they may output at a shifted and incorrect frequency (color), pose a fire safety risk, etc. This is particularly true when pluralities of individual LEDs are arranged side-by-side in high density to form an LED lamp, such as in the aforementioned residential and commercial applications.

A traditional method of solving the heat dissipation problem is use of heat sink comprising a plurality of cooling fins attached to a base of the lamp. The heat generated by the LEDs is conducted to the cooling fins via the base, and then dissipated into ambient air by the cooling fins. However, this method is only suitable for low power consumption LED lamps, and is not suitable for high power consumption LED lamps. Furthermore, cooling fins are typically relatively large, and can limit the applications for LED lamps.

Another method of heat dissipation is using a conventional heat pipe or a loop heat pipe. The heat dissipation efficiency of these heat pipes, however, is limited by their low heat flux per unit area, and consequently these heat pipes are easy to dry out when subjected to a large amount of heat. In a further known method, a pulsating heat pipe may be employed, such as taught by U.S. Patent Application Publ. 2008/0117637, which is incorporated herein by reference. While a heat pipe is effective for heat dissipation, in each of these cases the heat pipe comprises copper or similar tubing bent and shaped to be applied to the surface of the lamp reflector. This tubing adds cost and effort to manufacturing, limits the topologies of possible cooling tube arrangements, limits the cooling pipe cross section options, increases the cost of the final lamp product, etc.

Therefore, there is a need in the art for an improved LED lamp cooling apparatus. In particular, there is a need for an improved method and apparatus that spreads heat over a large area without significantly increasing the size of a lamp package nor requiring forming and attaching elements to the lamp reflector. Still further, there is a need for an improved integrated cooling apparatus and reflector and method of making same.

SUMMARY

Accordingly, the present disclosure is directed to solid-state lamp packages and methods providing improved cooling of the lamp by forming cooling channels over the back surface of the lamp reflector, integrated with the reflector body, utilizing a thermal spray process. A low-cost integrated reflector and heat spreader for high-density high power solid-state (e.g., LED) lighting arrays is provided.

According to one aspect of the disclosure a reflector body is provided having, for example a concave reflecting surface and a corresponding convex back side surface. A sacrificial material is formed over the back side surface in a pattern that will ultimately represent channels through which a cooling fluid may flow. A wide variety of different patters are contemplated herein, dictated by many considerations such as target cost, desired cooling, cooling fluid, and so forth.

A thermal spray coating is then applied over the backside of the reflector body and sacrificial material. This thermal spray coating is relatively thick, and completely encapsulates the sacrificial material therein. The sacrificial material may be removed from within the thermal spray coating layer, for example by sufficiently raising the temperature of the thermal coating after formation, and extracted for example through an appropriate orifice. With the sacrificial material removed, a channel remains within the thermal spray coating layer into which the cooling fluid may be introduced. The cooling fluid may operate within the channel by capillary action, resulting in a pulsating heat pipe cooling mechanism on the backside of the reflector body. A solid-state light emitting device(s) may then be secured to the integrated reflector and cooling body.

In one embodiment the pulsating heat pipe forms an integral portion of the reflector body itself. Improved thermal contact is thereby provided.

A virtually infinite number of different topologies can be created for the cooling channels. Varying cross-sections and other channel attributes may be tailored to obtain desired pulse conditions and other cooling fluid flow properties.

The process of fabricating the integrated cooling channels and reflector body is relatively simple and low cost. This permits a reduction in the cost of effectively cooled solid-state lamps.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings.

DETAILED DESCRIPTION

We initially point out that description of well-known starting materials, processing techniques, components, equipment and other well-known details are merely summarized or are omitted so as not to unnecessarily obscure the details of the present invention. Thus, where details are otherwise well known, we leave it to the application of the present invention to suggest or dictate choices relating to those details.

Figure 1:
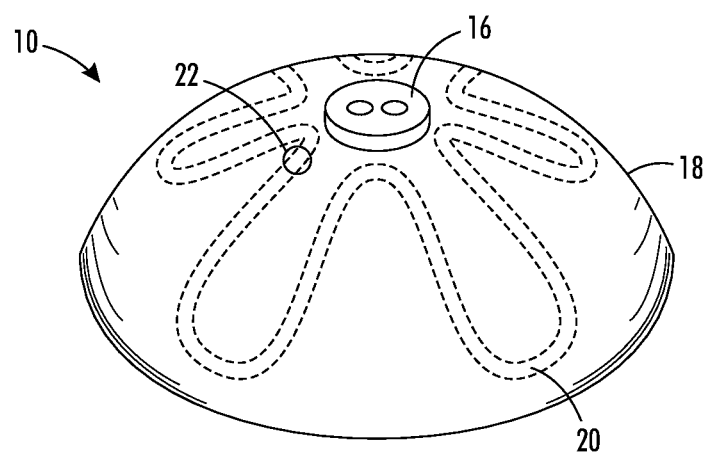
FIG. 1 is a perspective view of an integrated reflector and thermal spreader, with a continuous single channel for cooling fluid formed therein, according to a first embodiment of the present disclosure.
Figure 2:
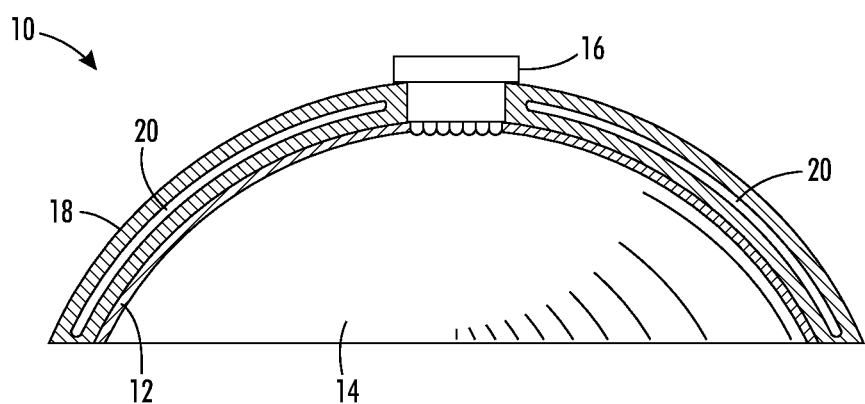
FIG. 2 is a cut-away side view of the integrated reflector and thermal spreader shown in FIG. 1.

With reference first to FIG. 1, there is shown therein a perspective view of an integrated reflector and thermal spreader 10 according to a first embodiment of the present disclosure. FIG. 2 is a cut-away view of the integrated reflector and thermal spreader 10 shown in FIG. 1. Integrated reflector and thermal spreader 10 comprises a base reflector body 12 over which one or more layers are formed.

A first layer is a reflective coating 14 applied to the "front" side of base reflector body 12. As used herein, the "front" side of the reflector body is generally the concave surface intended to reflect and direct light emitted by a solid-state light emitting device 16 that will be disposed within the finished integrated reflector and thermal spreader 10.

A relatively thick thermal spray coating material layer 18 is applied over the "back" side of reflector body 12. The "back" side of the reflector body is generally the convex surface opposite the surface receiving the reflective coating 14. The back side of the reflector body is generally that region to which a cooling structure is applied. One or more channels 20 are formed in relatively thick thermal spray coating material layer 18 to accommodate a cooling liquid (not shown). One more ports 22 may be provided to fill channels 20 with cooling liquid. The process of manufacturing the integrated reflector and thermal spreader 10, and various different embodiments are next discussed.

Figure 3:
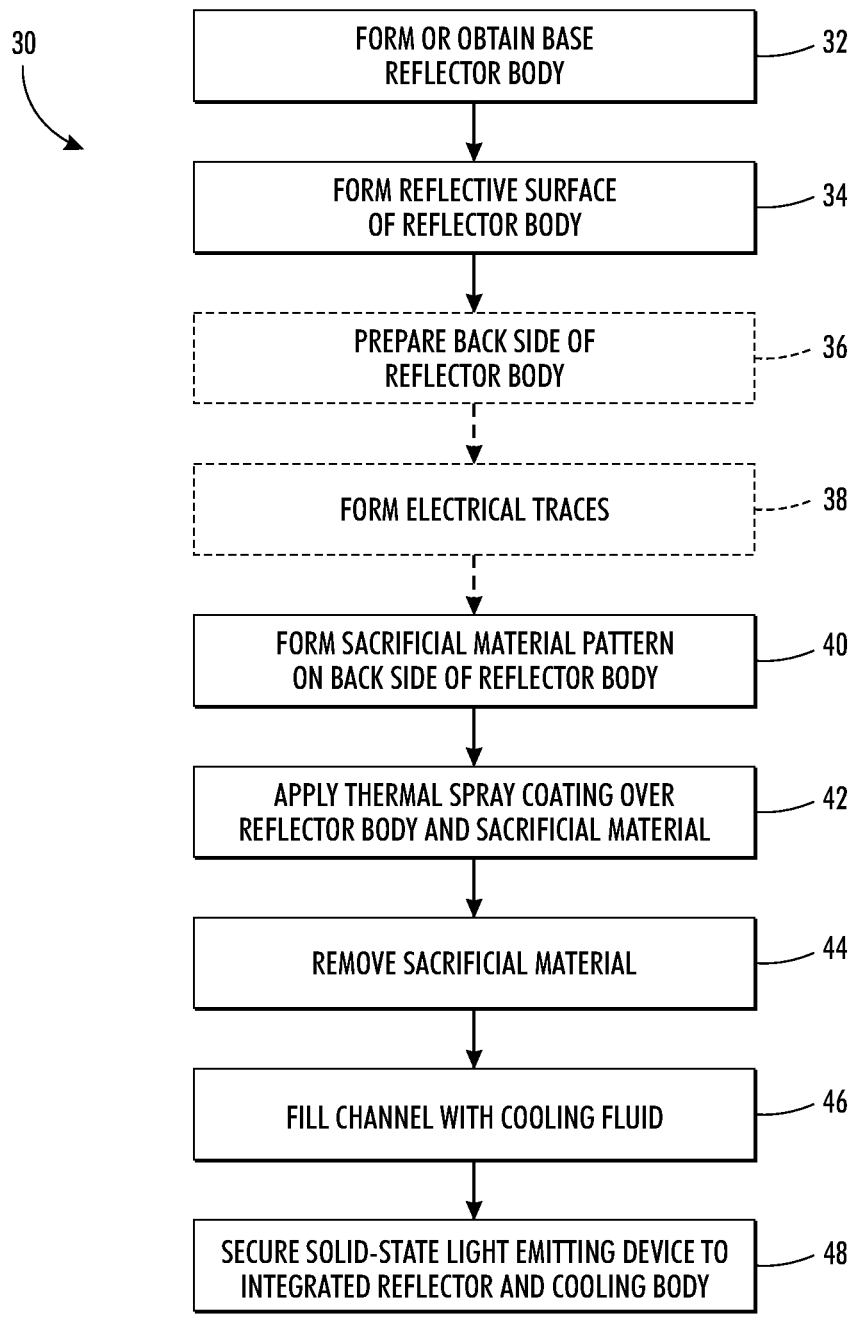
FIG. 3 is a process flow diagram illustrating the steps of forming an integrated reflector and thermal spreader according to an embodiment of the present disclosure.
Figure 4:
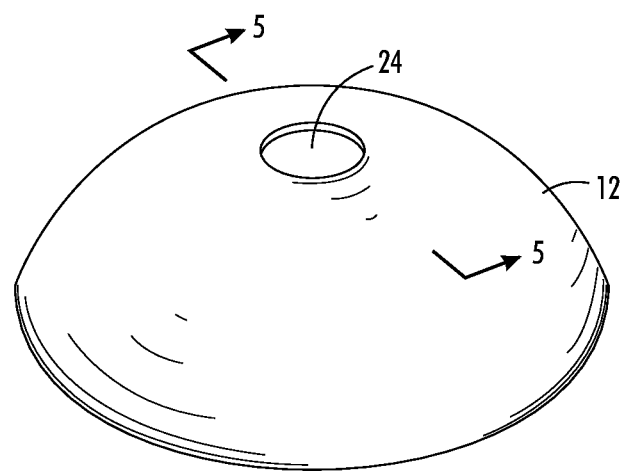
FIG. 4 is a perspective view of an example of a base reflector body that may be used in the formation of an integrated reflector and thermal spreader according to an embodiment of the present disclosure.
Figure 5:
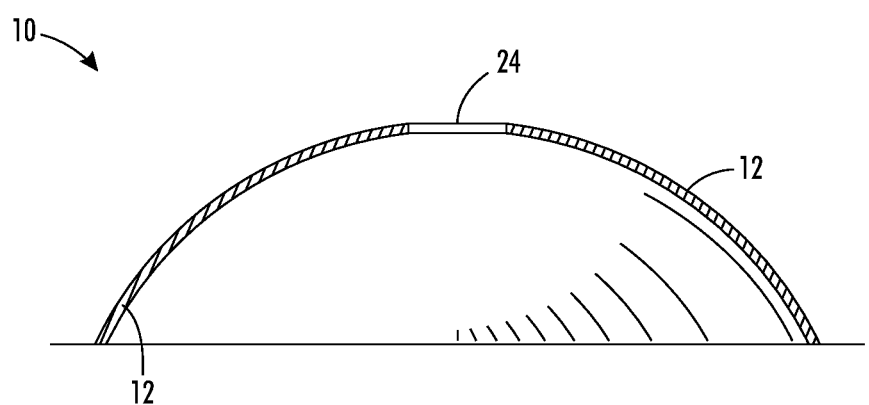
FIG. 5 is a cut-away side view of the base reflector body shown in FIG. 4.

With reference to FIG. 3, the steps of one embodiment of a method 30 for the fabrication of an integrated reflector and cooling body according to the present disclosure are shown. In a first step 32, base reflector body 12 is formed or otherwise obtained. FIG. 4 is a perspective view of an example of a base reflector body 12, which may comprise an appropriately shaped and sized metal, ceramic, plastic, etc. structure. In the embodiment shown in FIG. 4, base reflector body is a generally parabolic structure with a light emitter receiving region 24 formed at its vertex. Many other shapes of base reflector body 12 are contemplated, and may be selected depending on the intended application of a device according to the present disclosure. FIG. 5 is a cut-away cross section view of base reflector body 12 shown in FIG. 4. Base reflector body 12 may be cast or molded metal, molded low-iron glass, or other known material. Alternatively, separate pieces may be glued or otherwise coupled together to form base reflector body 12.

Reflective coating 14 is next formed on the front side of the base reflector body at step 34 of FIG. 3. This reflective surface may be formed by polishing the material comprising base reflector body 12, depositing an appropriate material on the front side of the base reflector body 12, or by other methods. In the case where a reflective material is deposited, any suitable reflective material may be used, taking into account factors such as but not limited to the wavelengths of light to be reflected, bonding of the reflective material to the reflector body material, and cost. In some embodiments, the reflective material may include a mirror coating, a dielectric enhancement coating, and/or a protective dielectric or polymer paint coating. The reflective material may be deposited by sputtering or other physical vapor deposition, liquid deposition, etc. In one embodiment, the reflective material comprises sputtered silver or aluminum.

The back side of base reflector body 12 may optionally be prepared at step 36. One preparation is the application of a polymer, for example by powder-coating, onto the back side of the reflector body. The polymer may comprise an electrical insulator, and the powder-coating may proceed according to any method that is or becomes known. The polymer may act as a mechanical buffer layer between base reflector body 12 and a conductive material as well as a thermal spray coating applied in subsequent steps. This buffer layer can also be deposited by other means such as spraying, dipping or lamination. According to some embodiments, other suitable insulators such as any dielectrics, polyester, epoxy and polyurethane are powder-coated onto the optical element at step 36. The buffer and/or insulative layers applied at step 36 are not shown in the devices of FIGS. 1 and 2.

At optional step 38, one or more electrically conductive traces may be formed on the surface of the prepared back side of the base reflector body. These traces may be applied by way of a stencil pattern and sputtering, spray coating, or other similar application, physically applying conductive tape or wire, or by some other process. In some embodiments no electrical traces are required, and step 36 of preparing the back side of the base reflector body may be modified or eliminated.

At step 40 a sacrificial material 26 is applied to the surface of the base reflector body, which acts as a positive form for channel(s) 20 (FIG. 1) to be formed in the thermal spray coating material layer 18 (FIG. 1) subsequently applied. The sacrificial material may be a wax material, such as a printed wax, wax ribbon, etc. conformably applied to the back side of base reflector body 12. In one embodiment, sacrificial material is a mixture of copper and wax. Wax is a convenient material in that is generally flexible and conformable, can be formed into a variety of different cross sections, is a relatively low cost material, and can be readily melted and removed. Many different patterns, cross-sections, diameters, etc. of the sacrificial material may be formed, and a reasonably large portion of the surface area of the back side of the base reflector body may be covered by the sacrificial material, ultimately providing an effective cooling structure.

Figure 6:
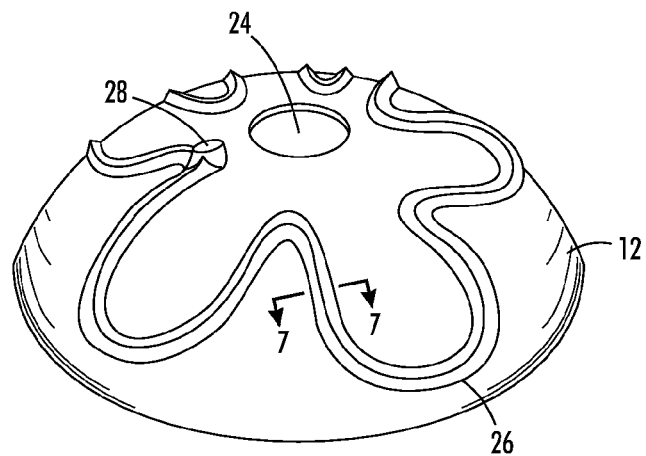
FIG. 6 is a perspective view of an example of a base reflector body having a sacrificial material disposed thereover so as to form a positive form in the formation of an integrated reflector and thermal spreader according to an embodiment of the present disclosure.
Figure 7:
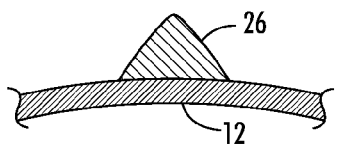
FIG. 7 is a cut-away axial view of a portion of FIG. 6, showing a generally triangular cross-section of the sacrificial material over a portion of the base reflector body part-way through the process of forming an integrated reflector and thermal spreader according to an embodiment of the present disclosure.
Figure 7A:
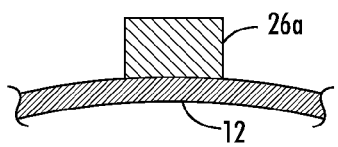
Figure 7B:
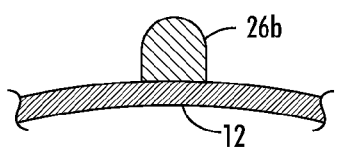
Figure 12:
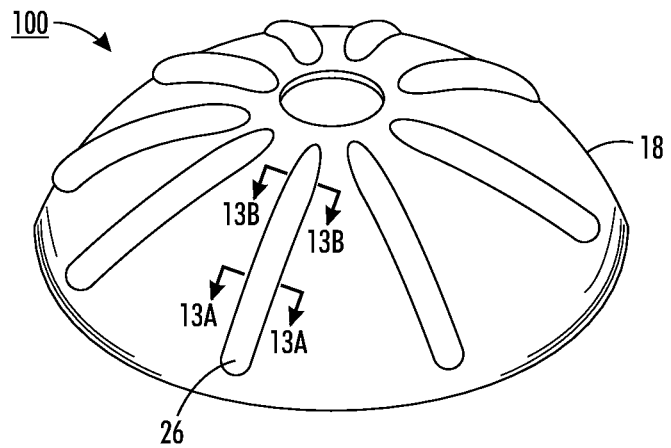
FIG. 12 is a perspective view of an integrated reflector and thermal spreader, with several discrete radial channels for cooling fluid formed therein, each channel having a cross-section that changes along its long axis, according to yet another embodiment of the present disclosure.
Figure 13A:
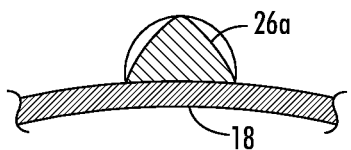
FIGS. 13A and 13B are cut-away axial views of a portion of FIG. 12, showing a cross-section of the channel which changes from generally triangular to generally circular along its axial length.
Figure 13B:
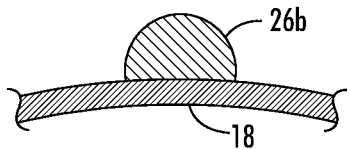

FIG. 6 shows sacrificial material 26 applied to base reflector body 12 according to one embodiment of the present disclosure. FIG. 7 shows a cross-section of sacrificial material 26, in this case of generally triangular cross-section, applied to base reflector body 12 according to one embodiment of the present disclosure. Other cross-sections, such as rectangular (FIG. 7A), oval (FIG. 7B), other polygonal, or a combination of such cross-section shapes may be used for sacrificial material 26. In one embodiment, it may be desired to have the cross-section shape gradually transition from one shape, such as triangular, closest to region 24 to another shape, such as round farthest from region 24 (as illustrated by embodiment 100 in FIGS. 12, 13A, and 13B).

One or more termination regions 28 may be provided in sacrificial material 26 that are built up to be taller than the bulk of sacrificial material 26 and forms port 22 (FIG. 1). Termination region 28 may be comprised of the same material as sacrificial material 26, or may be some other sacrificial or even permanent material as may be selected according to the application. As an alternative to termination region 28, a uniform sacrificial material 26 may be deposited, and a port cut into the coating encasing the sacrificial material 26 described further below.

Sacrificial material 26 will ultimately form channels for carrying a cooling medium. Various channel designs may be obtained. In a first such design, known as a pulsating heat pipe (PHP), a serpentine flow passage is typically required. Thus, in this embodiment, sacrificial material 26 will be printed in such a pattern. Channel diameters for PHPs vary from several hundred microns to approximately 1 centimeter (cm) in inside diameter (ID). For the pulsating heat pipe, it is essential that the fluid path be both (a) closed and (b) serpentine so that there are alternating sections at the hot and cold ends of the reflector. The cross section shape is not critical, since the PHP uses the boiling action of the fluid within the channel as a means to pump the fluid, and heat is transferred both by motion of the fluid and the latent heat exchange between the hot and cold ends where evaporation and condensation occur, respectively. For a discussion of PHPs, see Groll, Manfred et al., "Keynote Paper-State of the Art on Pulsating Heat Pipes", Proceedings of ICMM2004, 2nd International Conference on Microchannels and Minichannels (June, 2004).

In another embodiment, known as a micro heat-pipe, an evaporation-condensation cycle is facilitated by a wicking structure within the channels. Channels formed by sacrificial material 26 are oriented radially from the center to the edge. The end of the channel at the center (proximate light emitting device 16) will be the evaporator and the end at the opposite, colder edge will be the condenser. In this case, sacrificial material 26 is formed to have "corners". For a discussion of heat pipe cross-sections, see, C. Sobhan et al., "A review and comparative study of the investigations on micro heat pipes", Int. J. of Energy Res., vol. 31, pp. 664-688 (2007), which is incorporated herein by reference.

At step 42 of FIG. 3, a relatively thick coating material is then applied, for example by way of thermal spray techniques, to cover the back side of the base reflector body and encapsulate the sacrificial material. This coating material layer (18 of FIG. 1) may comprise any material that is capable of being thermally sprayed. The steps of the thermal spray method, as well as appropriate materials therefor, are fully described in the aforementioned U.S. Patent Application Publ. 2009/0025784. The thermal spraying coating material may include heating a powder to a molten state and spraying the molten powder onto the back side of the base reflector body. The molten powder then cools to produce the solid layer of coating material layer 18. In various embodiments, the thickness of the solid layer of coating material layer 18 is on the order of several hundred microns to several millimeters depending on the channel density and desired thermal operating parameters. High velocity oxyfuel spray coating, using a supersonic ejector to deposit material on the substrate with very high kinetic energy forms one embodiment for obtaining such a coating thickness.

The thermal spraying may be performed using a known twin wire arc process in a case that the coating material is a metal. Plasma spray techniques may be employed at step 42 if the coating material is a metal or a ceramic. Moreover, if the coating material is a polymer (e.g., polyester, epoxy, polyurethane, etc.), it may be powder coated onto the optical element at step 42. Accordingly, the term thermal spraying as used herein encompasses at least twin wire arcing, plasma spraying (e.g., hot, cold, assisted), and powder coating.

Thermal spraying the material onto the back side of the base reflector body may comprise spraying the material onto other material(s) already deposited on the base reflector body, such as the polymer coating applied at optional step 36. While discussed primarily here as being an optical reflector, reflector body 12 may serve additional functions simultaneously, such as being a lens, a partly transmissive structure, etc. Thus, certain of these other materials may assist with these other functions, and the thermal spray material is chosen and applied to work in concert with these other materials and functions. In one embodiment of a micro heat pipe, the thermal spray layer has a target thickness between 100 microns ($\mu$m) and 1 millimeter (mm). For PHP embodiments, the thermal spray layer target thickness may be up to a practical limit for reflector thickness, for example as much as 5 mm or more.

Once the thermal spray material is sufficiently hardened, the sacrificial material 26 is removed at step 44 of the method of FIG. 3. Depending on the material comprising sacrificial material 26, this removal may comprise heating and extracting the liquefied sacrificial material through a port (such as that described above or formed by etching or cutting into the channel(s) specifically for this purpose and subsequently resealed), either through gravity, positive pressure, or a vacuum. Other forms of sacrificial material, which combust rather than melt at high heat, may similarly be removed by heating. The result is a relatively thick coating over the back side of the base reflector body having one or more channels formed therein, such as shown in FIG. 1.

At step 46 of FIG. 3, the channels may then be filled with a cooling fluid through port(s) formed through the relatively thick thermal spray material. A wide variety of different cooling fluid may be employed depending on the application of the device disclosed herein. In one embodiment, the cooling fluid is saturated steam. In another embodiment, the cooling fluid is another coolant, such as water, alcohol, propylene glycol, ethylene glycol, etc. Once the fluid is introduced, the port may be temporarily or permanently closed, such as by a cap, solder or brazing, crimping, etc. so as to form a closed cooling system within the relatively thick thermal spray material.

Finally, at step 48 of FIG. 3, a solid-state light source is coupled to the integrated reflector and cooling thermal spreader. Structurally, this is shown for example in FIG. 1 wherein solid-state light source 16 is shown coupled to the integrated reflector and cooling thermal spreader 10. The coupling may be temporary or permanent. The coupling may be via other material(s) already deposited on the reflector body. For example, an electrical contact of the solid-state light source 16 may be coupled to conductive material deposited on the base reflector body. Such a coupling may form an electrical and a mechanical interconnection between the conductive material and the solid-state light source 16. Various flip-chip bonding techniques may be employed in some embodiments to couple an electrical contact of solid-state light source 16 to conductive material deposited on the optical element. In other embodiments, solid-state light source 16 is simply mechanically secured to the reflector body and electrical connection thereto is made separate from the reflector body, such as by a dedicated connector or the like.

The filled channel may serve as a heat transfer mechanism, such as a pulsating heat pipe. The heat pipe includes a plurality of heat receiving portions proximate the solid-state light source (source of heat to be dissipated) and a plurality of heat radiating portions. The heat energy generated by the solid-state light source is transferred from the heat receiving portions to the heat radiating portions of the pulsating heat pipe through pulsation or oscillation of the working fluid in the pulsating heat pipe. The heat energy at the heat radiating portions may then be readily dissipated into the environment, heat sink fins, etc.

Figure 8:
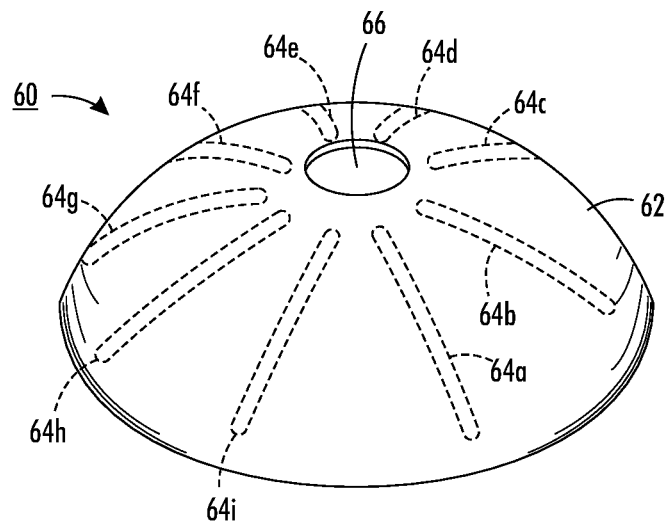
FIG. 8 is a perspective view of an integrated reflector and thermal spreader, with several discrete radial channels for cooling fluid formed therein, according to another embodiment of the present disclosure.
Figure 9:
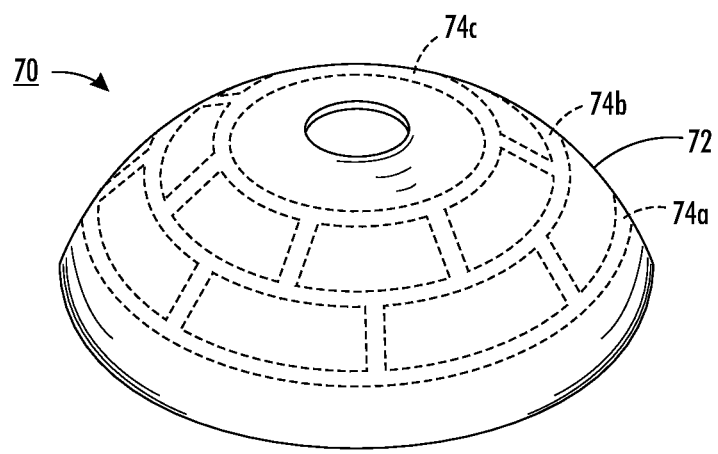
FIG. 9 is a perspective view of an integrated reflector and thermal spreader, with several discrete circumferential channels for cooling fluid formed therein, according to yet another embodiment of the present disclosure.

While a single channel 20 has been shown in FIGS. 1 and 2 and discussed above, it will be appreciated that the method disclosed herein may readily produce a structure such as integrated reflector and cooling thermal spreader 60 shown in FIG. 8 having a plurality of individual channels 64a, 64b, and so on, formed in a thermal spray coating 62. In the embodiment shown in FIG. 8, channels 64a, 64b, etc. extend radially outward from a light emitter receiving region 66. In another embodiment of a integrated reflector and cooling thermal spreader 70 shown in FIG. 9, individual channels 74a, 74b, 74c, etc. are arranged circumferentially, with interconnecting radial channels. In a pulsating heat pipe embodiment, the fluidic resistances at the junctions between circumferential and radial channels are tuned to ensure that there is a loop from hot sections to cold sections and back to hot sections. In a micro heat pipe embodiment, the channel profiles are controlled so that there is an effective wicking of the cooling fluid. Thus, the number, size, cross-sectional shape and other details of individual channels 64a, 64b, etc. will depend on the design and application of integrated reflector and cooling thermal spreader 60 as will be appreciated from the present disclosure.

Figure 10:
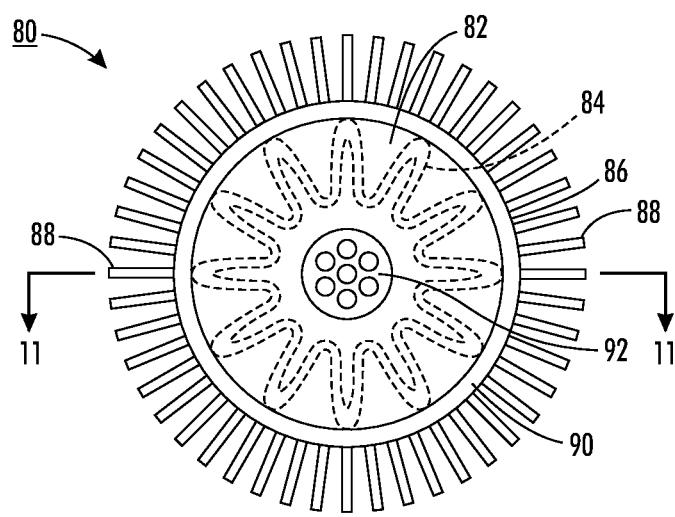
FIG. 10 is a bottom view of an integrated reflector and thermal spreader, with a continuous single channel for cooling fluid formed therein, together with a cooling fin structure and retaining ring, according to still another embodiment of the present disclosure.
Figure 11:
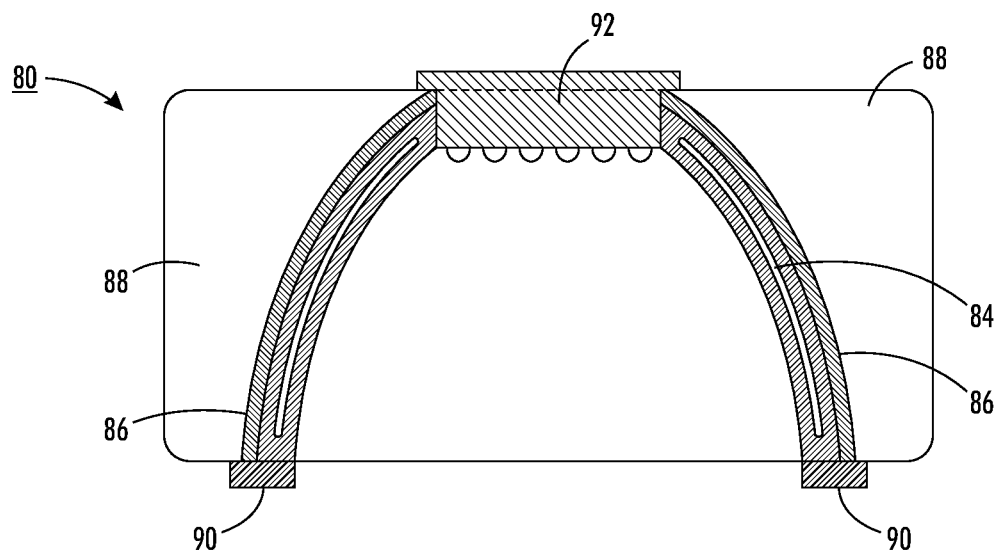
FIG. 11 is a cross-section cut-away view of the integrated reflector and thermal spreader, with a continuous single channel for cooling fluid formed therein, together with a cooling fin structure and retaining ring, shown in FIG. 10.

While integrated reflector and cooling thermal spreaders disclosed herein offers improved cooling for applications such as commercial and residential lighting, they may be used in conjunction with other cooling techniques and structures as may be appropriate for specific applications. For example, FIG. 10 illustrates a combined integrated reflector and cooling thermal spreader and cooling fin structure 80. A thermal spray structure 82 having channels formed therein of a type discussed above may be secured within an appropriately shaped opening within a cooling fin structure 86 which includes a plurality of cooling fins 88. Thermal spray structure 82 may be secured within cooling fin structure 86 by retaining ring 90, adhesive (not shown) or other mechanical fastener arrangement. Heat generated from solid-state light source 92 may then be very effectively dissipated.

It will be appreciated that no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. For example, while a process has been described above which forms a reflective surface on the front side of a base reflector body, and thermal spray coating having a channel(s) formed therein on the back side of the base reflector body, it is possible to form the thermal spray coating on the front side of the base reflector body, with a channel(s) formed therein, then forming the reflective surface on the surface of the thermal spray coating. Indeed, in some embodiments, no reflective surface is formed, and the inherent reflectivity and/or optical absorption of the base reflector body or thermal spray coating are sufficient for the application.

In addition, while the thermal spray coating described above has been employed to encase the sacrificial material and thereby form channels for cooling fluid therein, other complex structures may also be formed. For example, in addition to a body having a channel(s) formed therein, cooling fins may be formed on the body by the thermal spray process to produce a unitary, integrated reflector, cooling thermal spreader, and cooling fin structure. Indeed, the structure may be formed such that the fins themselves also include a channel(s) within which cooling fluid may be disposed.

Further still, various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. An integrated reflector and thermal spreader, comprising:
- a base structure having a first surface and a light emitter receiving region;
- a thermal spray coating layer formed over said first surface of said base structure except over said light emitter receiving region; and
- a substantially enclosed channel formed in said thermal spray coating layer, said channel in physical contact with said first surface of said base structure, and configured to receive and retain a cooling medium therein, said channel further configured in a serpentine pattern extending between a hot region of said base structure proximate said light emitter region and a cold region of said base structure spaced away from said hot region.

2. The integrated reflector and thermal spreader of claim 1, further comprising a sealable port formed in said thermal spray coating layer and communicatively coupled to said channel.

3. The integrated reflector and thermal spreader of claim 2, further comprising a cooling fluid disposed within said channel.

4. The integrated reflector and thermal spreader of claim 3, wherein said cooling fluid is selected from the group consisting of: water, saturated steam, alcohol, propylene glycol, and ethylene glycol.

5. The integrated reflector and thermal spreader of claim 4, wherein said channel with cooling fluid disposed therein comprises a pulsating heat pipe thermal spreader.

6. The integrated reflector and thermal spreader of claim 1, wherein said channel has a cross-section shape over a first portion of said base structure closest to said light emitter receiving region and a second different cross-section shape over a second portion of said base structure farthest from said light emitter receiving region.

7. The integrated reflector and thermal spreader of claim 1, further comprising a reflective coating on a second surface of said base structure opposite said first surface.

8. The integrated reflector and thermal spreader of claim 1, further comprising a solid-state light emitting device secured to said base structure at said light emitter receiving region.

9. The integrated reflector and thermal spreader of claim 1, further comprising a plurality of discrete channels formed in said thermal spray coating layer, each one of said channels being in physical contact with said first surface of said base structure.

* * * * *